(12) United States Patent
Singh (10) Patent No.: US 7,449,762 B1
(45) Date of Patent: Nov. 11, 2008

(54) LATERAL EPITAXIAL GAN METAL INSULATOR SEMICONDUCTOR FIELD EFFECT TRANSISTOR

(75) Inventor: Ranbir Singh, South Riding, VA (US)

(73) Assignee: Wide Bandgap LLC, South Riding, VA (US)

(*) Notice: Subject to any disclaimer, the term of this patent is extended or adjusted under 35 U.S.C. 154(b) by 216 days.

(21) Appl. No.: 11/399,452

(22) Filed: Apr. 7, 2006

(51) Int. Cl.
*H01L 23/58* (2006.01)
(52) U.S. Cl. .................. 257/493; 257/279; 257/287
(58) Field of Classification Search .......... 257/279, 257/287, 492, 493, 496
See application file for complete search history.

(56) References Cited

U.S. PATENT DOCUMENTS

| | | | |
|---|---|---|---|
| 5,264,713 A | 11/1993 | Palmour | |
| 5,329,142 A | 7/1994 | Kitagawa et al. | |
| 5,459,089 A | 10/1995 | Baliga | |
| 5,510,632 A | 4/1996 | Brown et al. | |
| 6,100,549 A | 8/2000 | Weitzel et al. | |
| 6,281,521 B1 | 8/2001 | Singh | |
| 6,285,046 B1 | 9/2001 | Kaminski et al. | |
| 6,373,318 B1 | 4/2002 | Dohnke et al. | |
| 6,465,863 B1 | 10/2002 | Deboy et al. | |
| 6,573,128 B1 | 6/2003 | Singh | |
| 6,600,375 B1 | 7/2003 | Morse et al. | |
| 6,693,308 B2 | 2/2004 | Sankin et al. | |
| 6,703,684 B2 | 3/2004 | Udrea et al. | |
| 6,822,275 B2 | 11/2004 | Harada et al. | |
| 6,822,842 B2 | 11/2004 | Friedrichs et al. | |
| 7,019,344 B2 | 3/2006 | Singh | |
| 7,026,669 B2 * | 4/2006 | Singh | 257/279 |
| 7,105,875 B2 | 9/2006 | Singh | |
| 2001/0024138 A1 | 9/2001 | Dohnke et al. | |
| 2002/0190258 A1 | 12/2002 | Harada et al. | |
| 2003/0168704 A1 | 9/2003 | Harada et al. | |
| 2003/0168919 A1 | 9/2003 | Friedrichs et al. | |

OTHER PUBLICATIONS

C Hatfield et al., "DC 1-V Characteristics and RF Performance of a 4H-SiC JFET at 773K," IEEE Transactions on Electron Devices, vol. 45, No. 9, Sep. 1998.
D. Alok et al., "4H-SiC RF Power MOSFETS," IEEE Electron Device Letters, vol. 22, No. 12, Dec. 2001.

(Continued)

*Primary Examiner*—Phuc T Dang
(74) *Attorney, Agent, or Firm*—McNeely Bodendorf LLP (57) ABSTRACT

A Lateral Epitaxial Gallium Nitride metal insulator semiconductor field effect transistor (LEGaN-MISFET) is described that includes a body region including at least one layer formed of Gallium Nitride having a first conductivity type formed on the substrate; a resurf layer of Gallium Nitride having a second conductivity type formed the body region; a source region in contact with the resurf layer; a drain region, in contact with the resurf layer and spaced apart from the source region; a gate metal insulator semiconductor (MIS) structure in contact with the body region including a gate contact; and a MIS conductive inversion channel along the surface of the body region in contact with the gate MIS structure. A lateral current conduction path may be formed in the resurf layer between the source region and the drain region connected by the MIS channel, where the lateral current conduction path is controlled by an applied gate source bias.

20 Claims, 6 Drawing Sheets

OTHER PUBLICATIONS

R. Singh et al., "High Temperature SiC Trench Gate p-IGBTs," IEEE Transactions on Electron Devices, vol. 50, No. 3, Mar. 2003.

S. Banerjee et al., "1300-V 6H-SiC Lateral MOSFETs with two RESURF Zone," IEEE Electron Device Letters, vol. 23, No. 10, Oct. 2002.

R. Singh et al., "SiC Power Schottky and PiN Diodes,"IEEE Transactions on Electron Devices, vol. 49, No. 4, Apr. 2002.

R. Singh et al., "Development of High-Current 4H-SiC ACCUFET," IEEE Transactions on Electron Devices, vol. 50, No. 2, Feb. 2003.

Trew et al., "The Potential of Diamond and SiC Electronic Devices for Microwave and Millimeter-Wave Power Applications," Proceedings of the IEEE, vol. 79, No. 5, May 1991.

Clarke et al., "Sic Microwave Power Technologies," Proceedings of the IEEE, vol. 90, No. 6, May 2002.

B. Jayant Baliga, "Trends in Power Semiconductor Devices," IEEE Transactions on Electron Devices, vol. 43, No. 10, Oct. 1996.

Friedricks et al., "Stacked high voltage switch based on SiC VJEFTs," ISPSD, Cambridge, UK, Apr. 14-17, 2003.

G. Kelner et al., "High Temperature Operation of s-Silicon Carbide Buried Gate Junction Field-Effect Transistors," Electronics Letters, vol. 27, No. 12, Jun. 6, 1991.

Meneghesso et al., "Trap Characterization in Buried-Gate N-Channel 6H-SiC JFETs," IEEE Electron Device Letters, vol. 22, No. 9, Sep. 2001.

Rozario et al., "Thermal Cycling Study of SiC BGJFETs," IEEE 1998.

B. Weis et al., "Turn-off and short curcuit behaviour of 4H SiC JFETs," IEEE 2001.

* cited by examiner

LATERAL EPITAXIAL GAN METAL INSULATOR SEMICONDUCTOR FIELD EFFECT TRANSISTOR

TECHNICAL FIELD

The following description relates generally to semiconductor devices, and in particular to power transistors using Gallium Nitride.

BACKGROUND

Most conventional semiconductor power transistors are almost exclusively formed using silicon (Si). Due to the relative maturity of the use of this semiconductor, the performance of conventional power transistors to carry high currents and block high voltages is closely approaching the theoretical limit for Si. For example, power MOSFETs made using Si have undergone many improvements over the past two decades allowing them to block 30 to 600 volts, while providing relatively low on-state resistance values.

However, there are many applications for power devices that require the ability to carry high currents and block voltages in the range of 300 V to 5 kV (and greater). These applications include motor control, power supply, lighting ballast, power transmission and generation, and utility power conversion. Unfortunately, the overall performance of power devices made using Si is poor for this voltage range, and the lack of such power devices represents the primary limitation in realizing circuits for these applications. In fact, if high voltage devices that support such high currents and operate at frequencies of one to 1 MHz were available, they would revolutionize power utility applications and result in power savings of as much as $2 billion in the United States.

One recent development in semiconductor power devices is the use of Intelligent Power Modules (IPMs). IPMs use low voltage CMOS circuitry that may be integrated with power devices. Other examples of intelligent power devices include discrete integrated power devices that detect unacceptable current, voltage, and temperature conditions. However, the relatively low blocking voltage of semiconductor power devices made using Si limits the application of these devices in majority carrier devices (e.g., devices that rely on resistive current transport) to 300 V or less.

For higher power devices (e.g., those blocking voltages greater than 300 V), bipolar devices, such as, insulated gate bipolar transistors (IGBTs) and Thyristors have been used. While these devices offer acceptable on-state performance, they suffer from relatively slow switching speeds and poor performance at high temperatures.

Other power devices that have been researched also suffer from various deficiencies. For example, Bipolar Junction Transistors (BJTs) use a current control gate rather than a preferable voltage control gate. Many vertical junction field effect transistors (JFETs) operate in a "normally-on" mode during their on-state condition; however, JFETs with the preferable "normally-off" mode have poor on-state resistances. Finally, thyristors have high on-state voltage drops (because of their inherent junction drop) and slow switching speeds.

A variety of power devices using silicon carbide (SiC) have been researched and implemented in an attempt to provide devices that block high voltages and carry high currents. One switching power device is the vertical power MOSFET. However, vertical power MOSFETs made using SiC suffer from poor performance and poor reliability because of low inversion layer channel mobility. In addition, the tunneling current between SiC and the gate dielectric of power devices made using SiC limits their reliability during long term operation. Unlike Silicon and Silicon Carbide, vertical Gallium Nitride (GaN) based power MOSFETs are not considered feasible presently due to the unavailability of native GaN substrates.

One example of a high power microwave device formed using GaN is the AlGaN/GaN HEMT. A HEMT is operated by controlling the source to drain current through modulating a two dimensional electron gas via a widebandgap AlGaN gate located between these two terminals. However, these devices suffer from poor reliability due to the high defect levels at the hetero-junction growth of AlGaN layer above the unoped GaN layer. Other devices that may be formed using GaN devices are GaN MESFETs and JFETs.

SUMMARY

In one general aspect, a Lateral Epitaxial Gallium Nitride metal insulator semiconductor field effect transistor (LEGaN-MISFET) includes: a body region including at least one layer formed of Gallium Nitride having a first conductivity type formed on the substrate; a resurf layer of Gallium Nitride having a second conductivity type formed the body region; a source region in contact with the resurf layer; a drain region, in contact with the resurf layer and spaced apart from the source region; a gate metal insulator semiconductor (MIS) structure in contact with the body region including a gate contact; and a MIS conductive inversion channel along the surface of the body region in contact with the gate MIS structure. The LEGaN-MISFET also may include a lateral current conduction path in the resurf layer between the source region and the drain region connected by the MIS channel, where the lateral current conduction path is controlled by an applied gate source bias.

The MIS gate structure may include a trench formed through the resurf layer in contact with the body region having side walls and a bottom, and a passivating dielectric layer formed on the walls and bottom wherein the gate contact is formed on the dielectric layer.

A source metal contact may be formed on the source region extending through the source region and resurf layer in electrical contact with the body region wherein a conductive inversion channel is formed by the channel when a sufficient positive bias is applied between the gate and source terminals.

The distance Ldrift of a side wall of the trench from the drain region primarily may determine the breakdown voltage of the device as long as the vertical breakdown voltage is greater than this voltage.

The LEGaN-MISFET may have a blocking voltage of 300V to 5 kV.

The LEGaN-MISFET also may include a substrate in contact with the body region wherein the substrate layer has a carrier concentration of dopant atoms of 0 cm$^{-3}$ to $1 \times 10^{22}$ cm$^{-3}$. The substrate layer may have a thickness of 100 to 500 µm.

The resurf layer may have a carrier concentration of dopant atoms of $1 \times 10^{15}$ cm$^{-3}$ to $1 \times 10^{19}$ cm$^{-3}$ and a thickness of 0.01 to 5 µm. The body region may have a carrier concentration of dopant atoms of less than $10^{17}$ cm$^{-3}$. The face of the gallium nitride may be one of 0001, 000-1, and 11-20. In addition, the LEGaN-MISFET may have a specific on resistance of less than 300 mΩ-cm$^2$.

The doping $N_{resurf}$ of the resurf layer by thickness of the resurf layer may be expressed as range of plus or minus 50% of:

$$\frac{1}{L_{Drift}} \int_0^{tresurf} \int_0^{L_{Drift}} N_{resurf}(x, y) \partial x \partial y = \frac{\varepsilon \times E_{cr}}{q}$$

where $E_{cr}$ is the critical breakdown electric field of the Gallium Nitride, $\in$ is the dielectric constant of Gallium Nitride, 'q' is the electronic charge, and $L_{Drift}$ is the distance between the drain region and the gate region.

The distance $L_{Drift}$ may be expressed as:

$$L_{Drift} = \frac{(\text{Between 2 and 1}) \times BV_{Lat}}{E_{cr}}$$

where $BV_{lat}$ is the lateral breakdown voltage between source and drain and $E_{cr}$ is the critical electric field of the semiconductor.

In one implementation the first conductivity type is p-type and the second conductivity type is n-type. In another, the first conductivity type is p-type and the second conductivity type is n-type.

The junction between the resurf layer and the body region may provide a voltage blocking PN junction below the current lateral conduction path in the resurf layer and the body region a substantially continuous, linear gradation of voltage in the resurf layer between the gate structure and the drain region.

Other features will be apparent from the description, the drawings, and the claims.

DESCRIPTION OF DRAWINGS

Like reference symbols in the various drawings indicate like elements.

DETAILED DESCRIPTION

The following description of the various implementations and embodiments illustrates general concepts of the invention which may suggest various alternatives to those skilled in the art. For example, the description makes reference to certain layers and regions being formed of a first conductivity type (e.g., n-type) and a second conductivity type (e.g., p-type) in addition to various dopings (e.g., + and −) of these areas. However, complementary devices also may be produced according to the descriptions below, such as, for example, the first conductivity type may be a p-type semiconductor and the second conductivity type may be an n-type semiconductor.

The various layers and regions may be fabricated using a number of conventional semiconductor fabrication techniques including solid source crystal growth, molecular beam epitaxy, gas source metal-organic chemical vapor deposition, wafer bonding, lithography, thermal oxidation, metallization, etching, reactive ion etching and/or combinations thereof.

It also will be appreciated that the figures show general concepts and that sizes and dimensions of layers or regions may be exaggerated for illustrative purposes to show general structures, and are not necessarily to scale. In addition, references to a layer being formed on another layer or substrate may contemplate that additional layers intervene Likewise, a referenced "layer" may include implementations formed of multiple layers or doping regions, consistent with the teachings described herein.

LEGaN-MISFET Cell Structure

The device structures described below are for fabrication using Gallium Nitride (GaN) with a bandgap (EG) of approximately 3 to 4 eV; however, one skilled o the art will appreciated that a device may be fabricated using any widebandgap semiconductor having a bandgap 2 to 8 eV, such as silicon carbide (with EG range of 2.1 eV to 4 eV), diamond (EG 5 eV), and aluminum nitride (EG 6.1 eV). All faces of the crystal structure of GaN may be used including, for example, the 0001, 000-1, 11-20, and 1-100 planes.

Figure 1:
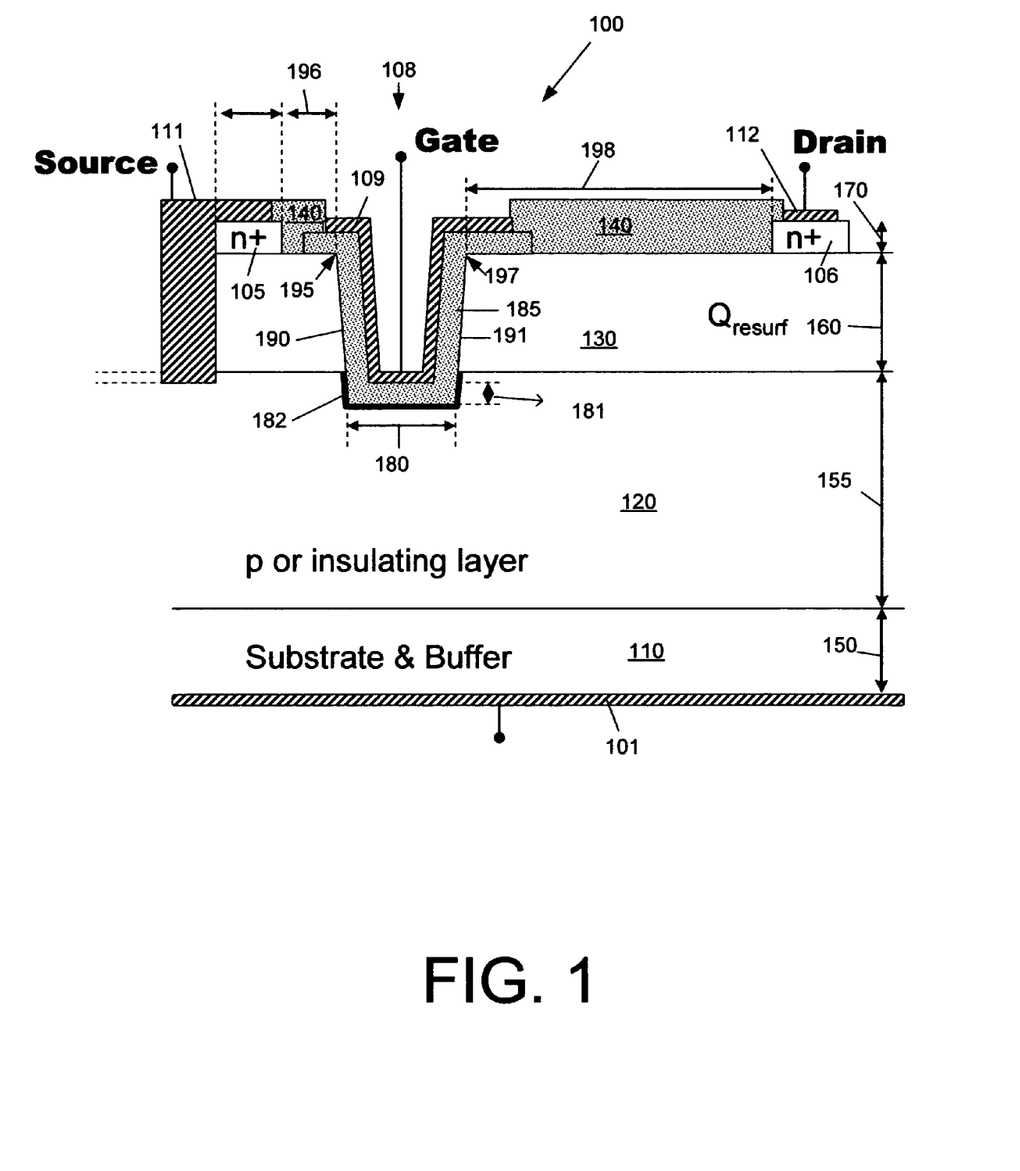
FIG. 1 shows an exemplary cell of a LEGaN-MISFET structure having an optimally doped, epitaxially grown conduction path between the Drain and the Source and a MIS channel formed in the p-type or insulating GaN layer by etching a trench into the epitaxial conduction path.

FIG. 1 shows the structure of a lateral epitaxial GaN metal insulator semiconductor field effect transistor (LEGaN-MISFET) formed in a Gallium Nitride. As shown by the exemplary implementation illustrated in FIG. 1, a cell 100 of the LEGaN-MISFET includes an optimally doped conduction path between a source region 105 and a drain region 106. The LEGaN-MISFET also includes a topside gate trench 108 with a gate metal insulator semiconductor (MIS) structure and gate contact 109 located between the source region 105 and the drain region 106.

The cell 100 may include three or more layers including a first layer 110 (e.g., a substrate and a buffer layer), a second layer 120 (e.g., a body region), and a third layer 130 (e.g., a resurf layer). The area between the source region 105, drain region 106, and the gate trench 108 may be formed using a passivating dielectric layer 140.

The first layer 110 may be formed using a substrate or a buffer layer or combination thereof having a backside metallized terminal 101. The metallized terminal 101 may be optionally shorted electrically to the source contact 111. For example, the substrate may be a mechanical wafer on top of which high quality crystalline Gallium Nitride may be grown using appropriate buffer layers, as is commonly practiced by those skilled in the art of GaN material growth. This region including all combined layers as referred to as layer 110. Commonly used substrate materials include, for example, Sapphire, Silicon, Silicon Carbide, Gallium Nitride, glass, diamond or other semi-insulating or insulating substrate material that provides a handle wafer with good mechanical and thermal properties to enable a device to be fabricated and have efficient performance. Buffer layers that may be used include, for example, Aluminum Nitride, Aluminum Gallium Nitride, and others as known by those skilled in art of heteroepitaxy growth of GaN. In one implementation, the layer 110 may have a thickness ($t_{substrate}$) 150 of approximately 100-500 μm with a doping of zero to $10^{22}$ cm$^{-3}$.

An optional very thin highly doped backside layer (not shown) of the same conductivity type as layer 110 may be ion implanted in the substrate 110 or epitaxially grown thereon having a thickness of 0.01 to 10 μm. The highly doped backside layer may be provided to prevent a vertical electric field from reaching the metallized gate terminal 101.

The second layer 120 may be formed of a low doped p-type conductivity semiconductor or insulating layer between layer 110 and layer 130. The layer 120 may be grown (e.g., using a high quality epitaxial process) on layer 110 to a thickness ($t_{bodyregion}$) 155 of one to 50 μm with an acceptor doping $N_A$ which may be referred to herein as the body region. Layer 120 should be included with a doping $N_A$, for example, less than $10^{17}$ cm$^{-3}$. A more precise description of how to determine $N_A$ is given below.

The layer 130 may be epitaxially grown with an optimal doping $N_{resurf}$ (x,y), which may vary along the resurf layer length (x-direction) and along the thickness of the resurf layer (y-direction). Tolerance on the doping $N_{resurf}$ and thickness ($t_{resurf}$) 160 of layer 130 is roughly plus or minus 50% from the optimal doping calculated using the design equations given below. Layer 130 may be doped from $10^{15}$ cm$^{-3}$ to $10^{19}$ cm$^{-3}$ having a thickness of 0.01 to 5.0 μm.

In one implementation, the source region 105 and drain region 106 may be formed of highly doped N+ areas to form low resistance ohmic contacts. The source region 105 and the drain region 106 may be epitaxially grown or ion implanted with N-type dopants like Silicon on layer 130 with doping, for example, greater than $10^{17}$ cm$^{-3}$ with a thickness 170 of 0.01 to 0.5 μm. The source region 105 and the drain region 106 are used to provide ohmic contacts for a source terminal 111 and a drain terminal 112.

Figure 2:
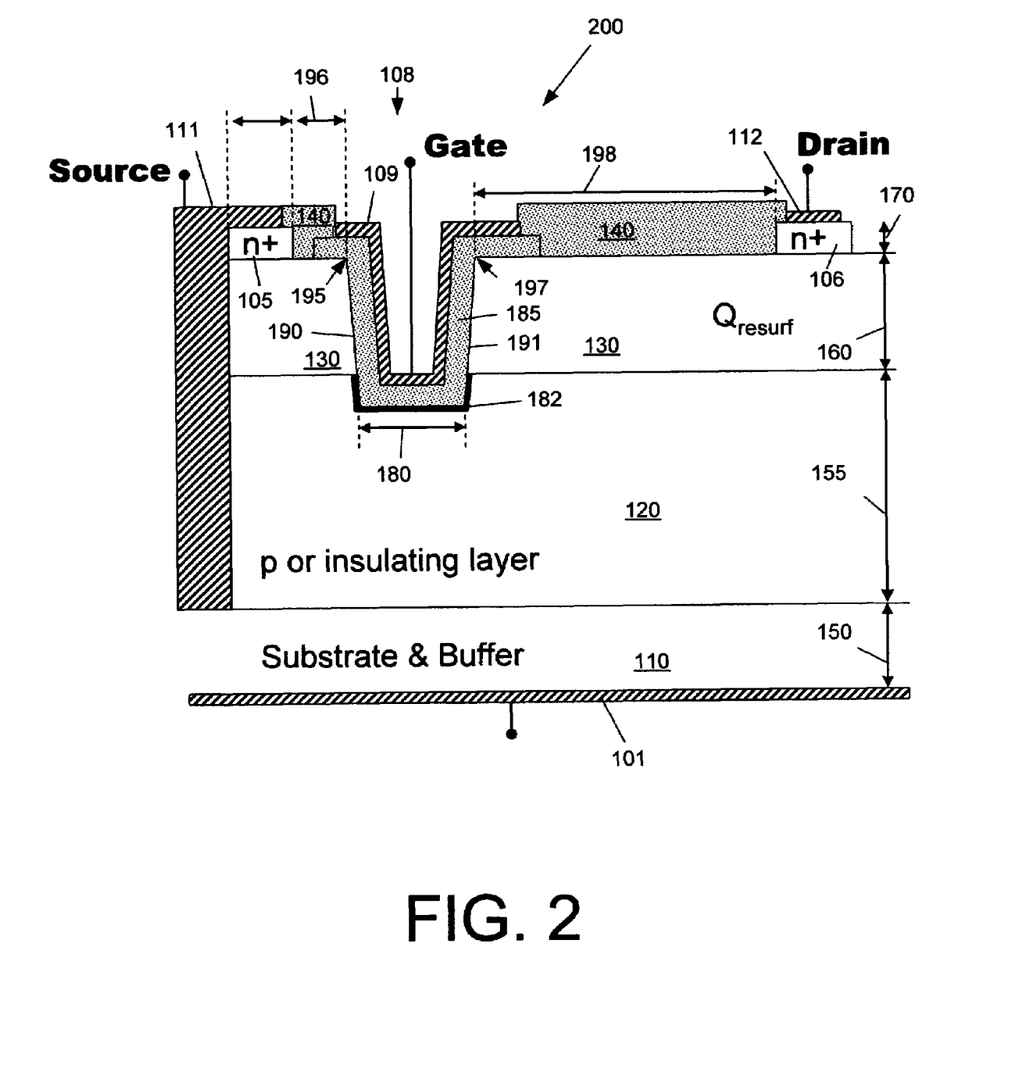
FIG. 2 shows another exemplary cell of a LEGaN-MISFET structure.
Figure 3:
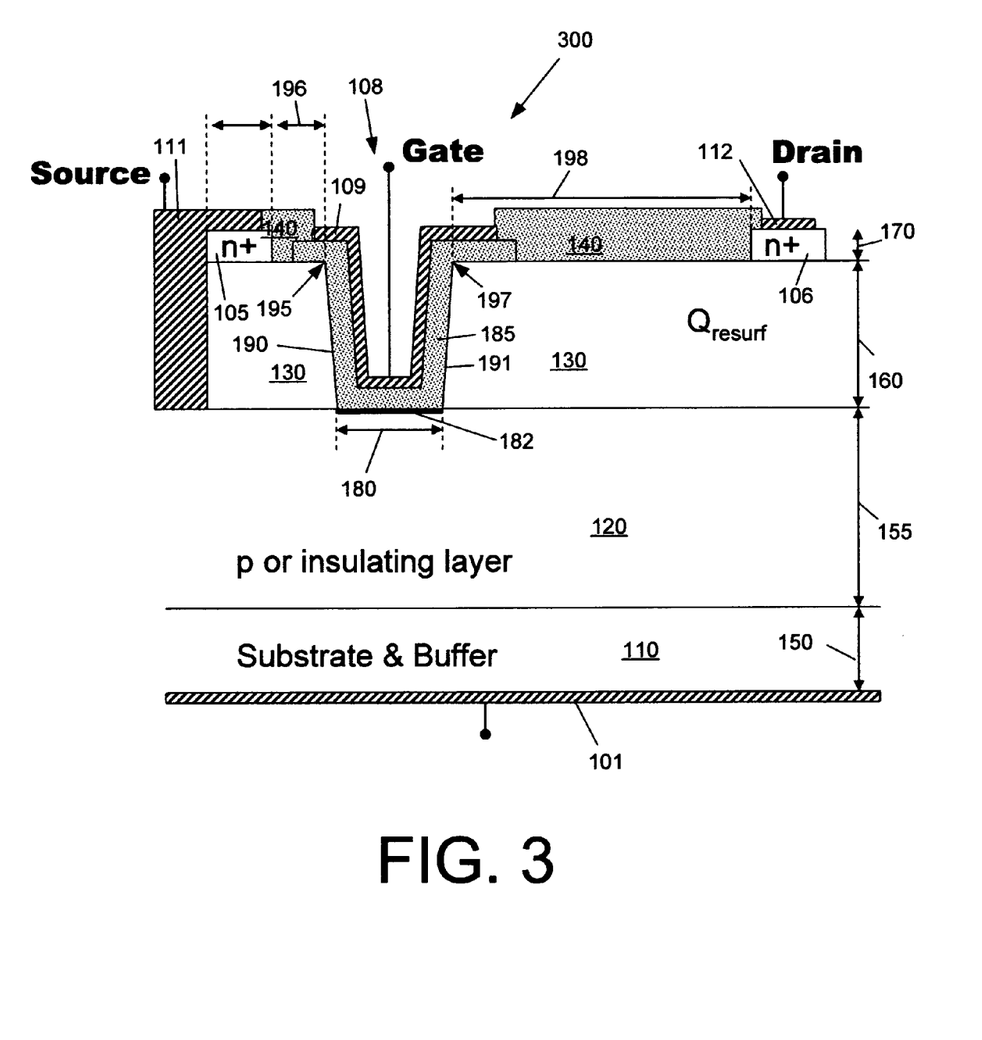
FIG. 3 shows yet another exemplary cell of a LEGaN-MISFET structure.

In one implementation, as shown in FIG. 1, the source terminal 111 is formed on and through the highly doped n+ source region 105, through the resurf layer 130 and into the body region or layer 120. The source terminal may extend to any depth of the body region; however, the embodiment in FIG. 1 shows a depth 145 of 0.01 to 5 μm into the body region or layer 120. In another implementation, as shown in FIG. 2, a cell 200 may be formed with the source terminal extending through the body region 120 to the substrate 110. In yet another embodiment, as shown in FIG. 3, a cell 300 may be formed with a source terminal 111 through the resurf layer 130 on the body region 120.

The source terminal 111 may optionally be shorted the substrate terminal 101. The source terminal contact 111 also provides an electrical contact to the body region 120 to enable a MIS structure to form a conductive inversion channel 182 when a sufficient positive bias, for example, a gate bias of 2 V to 40 V is applied between the source terminal 111 and gate terminal 109. The drain terminal 112 may be formed in contact with the drain region 106.

A topside gate region includes a gate trench 108 that may be formed in the resurf layer 130 and in the body region 120. The gate trench 108 may be formed by reactive ion etching the trench to the bottom of the resurf layer 130 exposing the body region 120 as shown in cell 300 of FIG. 3. However, because of the difficulty in precisely etching exactly to the surface of the body region 120, in one implementation as shown in FIG. 1, the trench 108 may be etched into the body region 120 to a depth 181, for example, of 0.02 to 5 μm. The base width 180 of the trench may be approximately 0.2 to 10 μm. A gate dielectric material 185 (e.g., Silicon Dioxide, Silicon Nitride, Gallium Oxide, or other similar insulator) may be deposited on the trench 108 including the walls 190, 191 of the trench 108 (formed by the etching of the resurf layer 130) and the exposed body region 120 (at the bottom of the trench 108), for example, using a chemical vapor deposition technique to a thickness of, for example, 0.01-1 μm. The conductive inversion channel 182 is formed in the body region 120 along its surface that is in contact with the gate dielectric material 185 of the trench 108.

A gate metal contact or terminal 109 may be formed on the gate dielectric material 185 through chemical vapor deposition, evaporation or sputtering. The gate metal terminal 109 may be formed, for example, of a highly doped n-type or p-type Polysilicon, Molybdenum, or Aluminum, among others commonly used in the formation of MIS structures in other materials systems.

The gate region may be placed in relative close proximity to the n+ source region 105. For example, the beginning 195 of the wall 190 of the gate trench 108 may be located beginning at a distance 196 from the source region 105 of 0.0 μm to 5 μm. The beginning 197 of the other wall 191 of the trench 108 on the drain side may be located at a distance or drift length ($L_{drift}$) 198 of 2 to 50 μm from the drain region 106, according to the design conditions described in further detail below. The drift length 198 determines the breakdown voltage of the device.

A passivating dielectric layer 140 may be formed between the drain region 106 and the source region 105 on the resurf layer 130. The dielectric may be, for example, silicon dioxide, silicon nitride, polyimide, deposited silicon carbide (SiC), deposited diamond, or other high-k dielectrics.

LEGaN-MISFET Design

A critical device parameter is the length of the conductive inversion channel 182 beginning at the source-side resurf layer, along the boundary of the p-type or insulating body region 120 in contact with the trench 108 to the drain-side of the resurf layer 130 formed inside. The source metal terminal 111 also provides an electrical contact to the body region 120 to enable the MIS structure to form the conductive inversion channel 182 when a sufficient positive bias is applied between the gate terminal 109 and the source terminal 111. The drift length 198 is defined as the spacing between the gate trench 108 and the drain N+ region 106, and this distance determines the breakdown voltage of the device, according to the design equations explained below.

The layer 130 ensures that the electric field at the top surface of layer 130 is sufficiently low (e.g., in one implementation 0 V/cm) when the LEGaN-MISFET is blocking its highest voltage (BV). In one implementation, an electric field of 0 V/cm may be maintained at the surface if the electric field at the voltage blocking junction (e.g., the junction between layer 120 and layer 130) is close to the critical breakdown electric field $E_{cr}$ of the Gallium Nitride, which is approximately 3-6 MV/cm.

The optimal doping of layer 130 by thickness of layer 130 may be expressed as:

$$\frac{1}{L_{Drift}} \int_0^{t_{resurf}} \int_0^{L_{Drift}} N_{resurf}(x, y) \partial x \partial y = \frac{\varepsilon \times E_{cr}}{q}$$

where $\in$ is the dielectric constant of the semiconductor (e.g., 9.0×$\in_r$ for GaN) where $\in_r$ is the permittivity for air (e.g., 8.854×10$^{-14}$ F/cm) and 'q' is the electronic charge (1.602×

$10^{-19}$ C). In this case, BV (i.e., the highest voltage blocked at the drain) may be expressed as the lesser of the two:

$BV_{Lat}$=(Between 1 and 0.5)×($L_{Drift}$×$E_{cr}$) (the approximate lateral breakdown condition); and $$BV_{Vert} = \frac{1}{2} \times t_{bodyregion}\left(E_{cr} + \frac{qN_A}{\varepsilon}t_{bodyregion} + \frac{1}{2} \times \frac{qN_A^2}{\varepsilon N_{Subs}}t_{bodyregion}\right)$$

(the approximate vertical breakdown condition) where $N_A$ is the body region doping. As can be seen, these two equations express two competing breakdowns: a vertical breakdown and a lateral breakdown. To design a LEGaN-MISFET with the lowest on-resistance for a given blocking voltage, the vertical blocking voltage should be greater than or equal to the lateral blocking voltage. Approximate formulae for the lateral and the vertical breakdowns are given above. If the vertical breakdown is greater than the lateral breakdown (disregarding any issues associated with processing), then there is a trade-off between the blocking voltage capability of the transistor and its on-resistance. In this case, the higher the breakdown voltage, the higher the on-resistance.

While these general formulae express the highest voltage blocked by the drain of the LEGaN-MISFET, the actual BV of any given LEGaN-MISFET may depend on a variety of factors, such as, for example, fabrication, processing, edge termination, and device dimensions.

Figure 4:
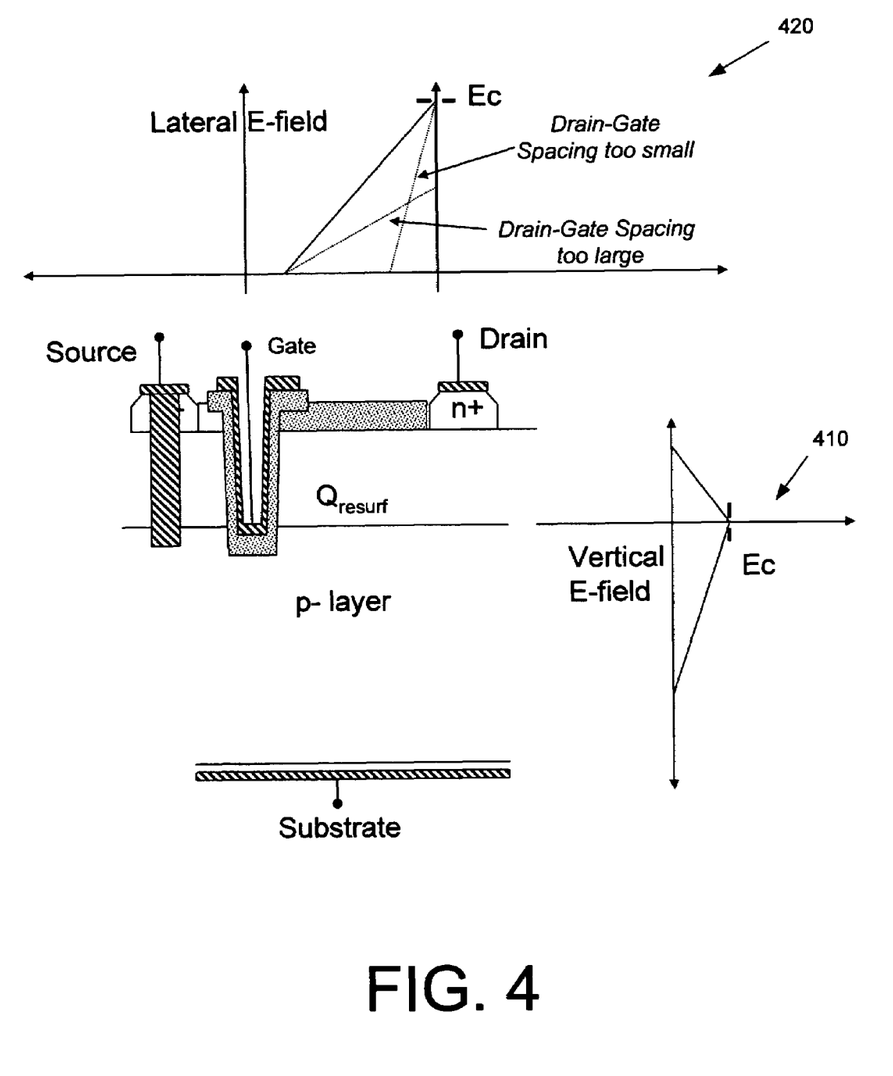
FIG. 4 shows an exemplary LEGaN-MISFET structure with illustrations of the vertical and the lateral electric fields.

FIG. 4 illustrates several electric fields in a cell 100 of the LEGaN-MISFET shown in FIG. 1, when $V_{gate}$=0 V, $V_{source}$=0 V, and $V_{drain}$=BV. The vertical electric field 410 along the drain-gate junction and the lateral electric field 420 close to the PN junction are plotted in FIG. 2.

As the drain voltage is increased, the electric field 410 between the bottom of the body region to drain junction increases until it approaches the critical electric field of the semiconductor $E_{cr}$ at the resurf layer-body region junction. When the applied drain voltage causes the substrate terminal to drain junction electric field to exceed $E_{cr}$, the LEGaN-MISFET suffers a substrate to drain breakdown (i.e., a vertical breakdown). The lateral breakdown voltage may be determined by the length of the drift region (i.e., $L_{drift}$). $L_{drift}$ may be determined so that the electric field 420 is near zero at the resurf layer under the topside gate region when the full BV is applied at the drain terminal.

A maximum voltage on the drain is supported with the least drift region resistance for the drift region length 198, which may be expressed as:

$$L_{Drift} = \frac{(\text{Between 2 and 1}) \times BV_{Lat}}{E_{cr}}$$

(assuming vertical breakdown does not occur before BV is achieved). For the condition that $L_{Drift}$ is sufficiently long as specified by this equation, the value of BV is as given previously for the defined lateral breakdown formula.

Operation of the LEGaN-MISFET

The operation of the LEGaN-MISFET is similar to a MOSFET. When the gate bias exceeds the threshold voltage of the MIS structure, the conductive inversion channel 182 forms a highly conductive electron-rich inversion layer. The threshold voltage of the LEGaN-MISFET may be determined from standard MIS physics. This parameter depends upon the dielectric thickness, dielectric constant, and doping of the body region. The electron-rich inversion layer in the conductive inversion channel 182 connects the source and drain portions of the resurf layer with a low resistance path, and the device is said to be in the 'on-state'. In the off-state, the gate and source regions are held at ground potential, while the drain potential is increased up to the breakdown voltage. In this mode of operation, only a small leakage current flows between the source and drain terminals, and the device is said to be in the 'off-state' or 'blocking state'. The device may be switched from an 'on-state' to the 'off-state' by reducing the gate to source bias to below the threshold voltage of the MIS structure.

Layout of the LEGaN-MISFET

Figure 5:
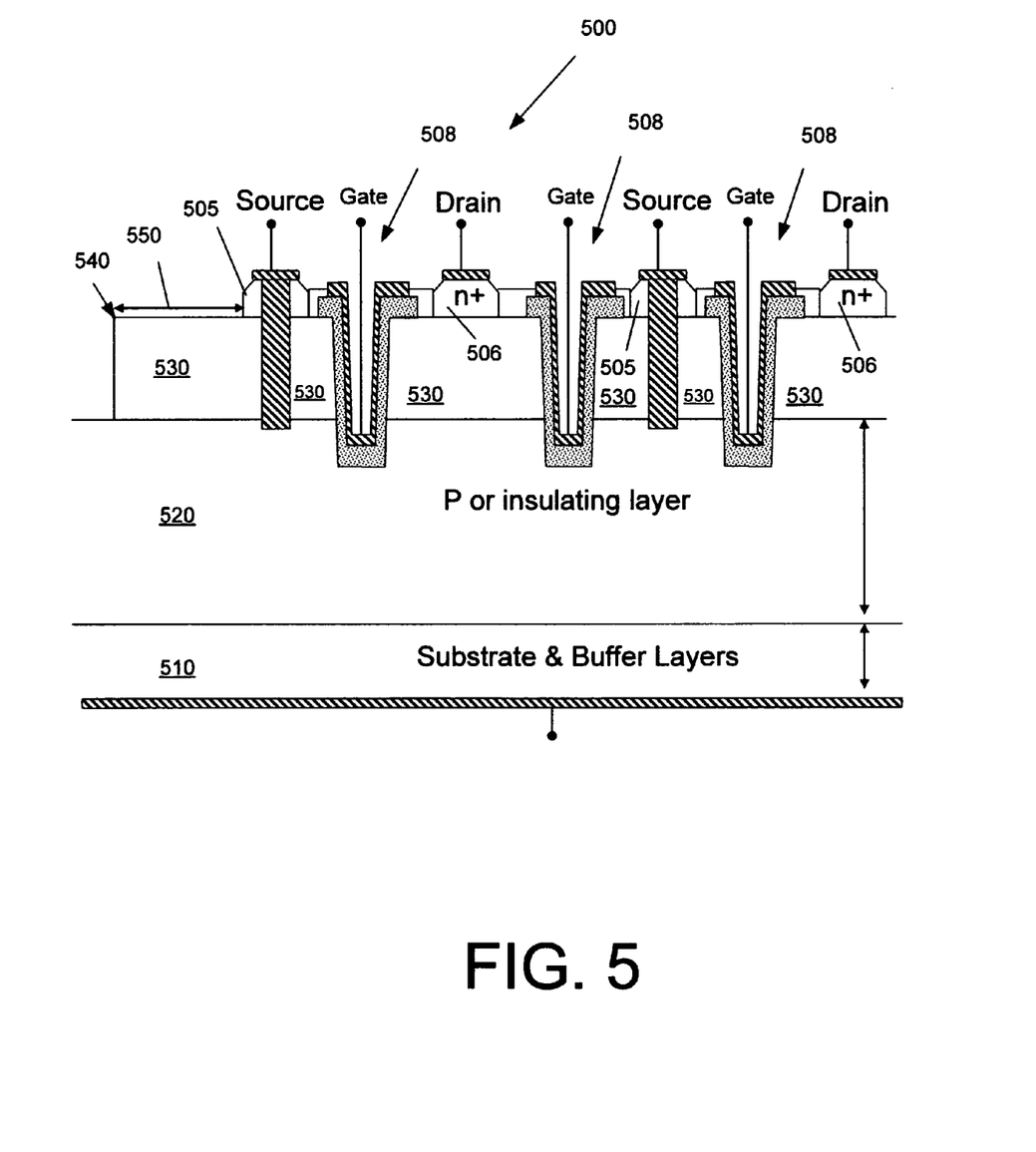
FIG. 5 shows an exemplary LEGaN-MISFET formed using the cells of FIG. 1.

The structure of a cell 100 of the LEGaN-MISFET is shown in FIG. 1 and described above. However, an entire power transistor chip may be formed using multiple cells 100. For example, FIG. 5 shows a schematic diagram of the cell 100 of FIG. 1 repeated and mirror imaged to form a power transistor chip 500. As shown in FIG. 5, one or more n type layers 530 are formed on one or more p type layers 520, and a substrate 510. In addition, a number of source regions 505 and drain regions 506 are formed on the n type layer. The edge 540 of the one or more n-type layers 530 does not necessarily extend to the edge of the substrate. To confine the electric field, the edge 540 of top n-type layer 530 may be extended beyond the source region 505 by a predetermined length ($L_{extend}$) 550. $L_{extend}$ may be determined by the BV rating of the device for which the LEGaN-MISFET is to be used, such as, for example, between zero to 200 μm.

Figure 6:
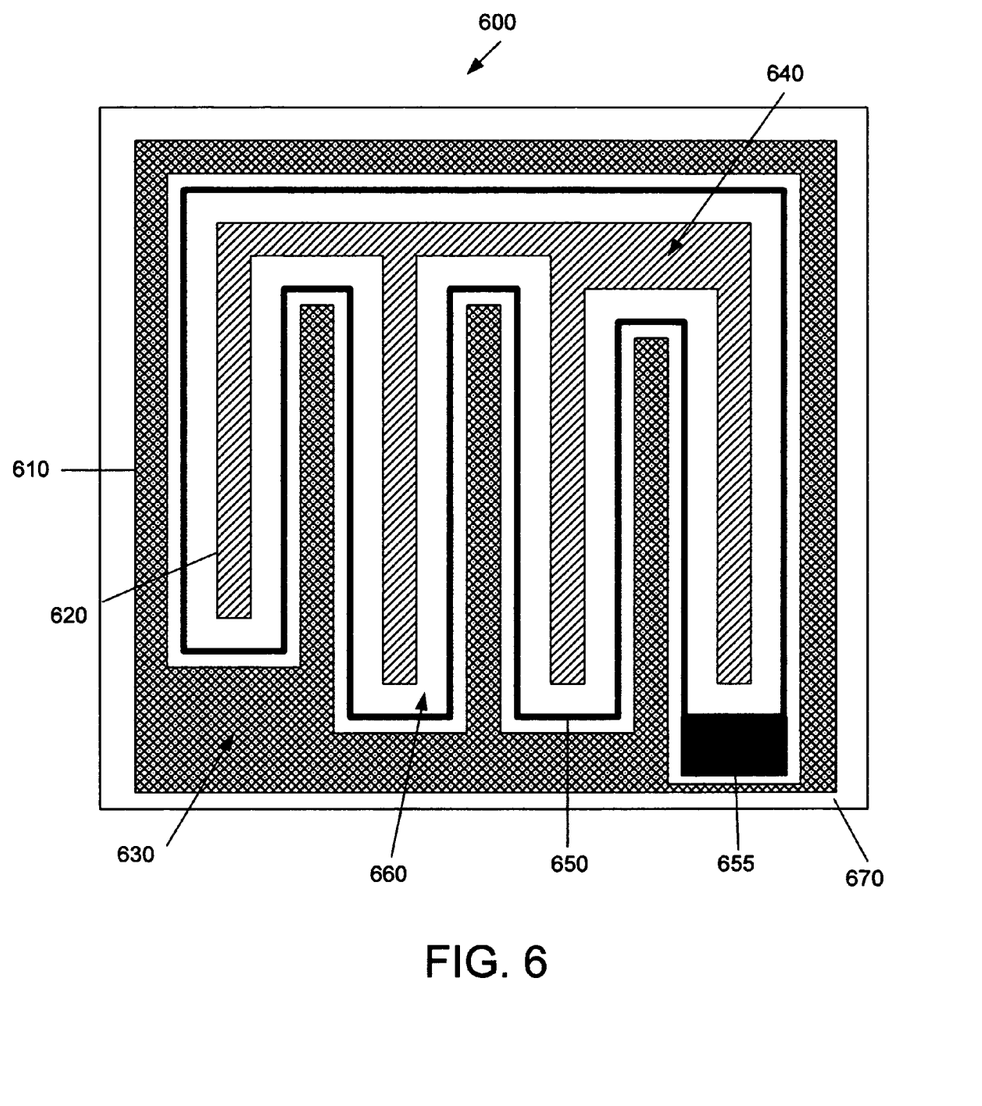
FIG. 6 shows an exemplary single chip, top view layout of a LEGaN-MISFET.

FIG. 6 shows an exemplary top view of a single chip 600 incorporating the LEGaN-MISFET structure. As shown, a source n+ metallization area 610 and a drain n+ metallization area 620 may form interdigitated fingers, connected by a source bond pad 630 and a drain bond pad 640, respectively. The topside gate trench 650 surrounds the drain metallization area 620 and is connected by a gate bond pad 655. A passivating dielectric region 660 that surrounds the gate region 650 may be formed to prevent surface flash-over between the Gate and Drain/Source terminals when high voltage is applied at the Drain terminal. The entire chip may be formed on a substrate 670. Other passivating dielectrics may also be formed over the entire structure, so that only the bond pad areas are exposed for packaging. Of course, other configurations of the source and drain regions may be implemented, for example, they may form a serpentine layout. Other configurations of the bond pads may be used including multiple source and drain bond pads with isolated fingers on the same chip.

A number of exemplary implementations have been described. Nevertheless, it will be understood that various modifications may be made. For example, suitable results may be achieved if the steps of described techniques are performed in a different order and/or if components in a described system, architecture, device, or circuit are combined in a different manner and/or replaced or supplemented by other components. Accordingly, other implementations are within the scope of the following claims.

What is claimed is:

1. A Lateral Epitaxial Gallium Nitride metal insulator semiconductor field effect transistor (LEGaN-MISFET) comprising:
    a body region including at least one layer formed of Gallium Nitride having a first conductivity type formed on a substrate;
    a resurf layer of Gallium Nitride having a second conductivity type formed on the body region;
    a source region in contact with the resurf layer;
    a drain region, in contact with the resurf layer and spaced apart from the source region;
    a gate metal insulator semiconductor (MIS) structure in contact with the body region, the gate MIS structure including a gate contact formed on a gate dielectric material; and a MIS conductive inversion channel along the surface of the body region in contact with the gate MIS structure.

2. The LEGaN-MISFET of claim 1 further comprising a lateral current conduction path in the resurf layer between the source region and the drain region connected by the MIS channel.

3. The LEGaN-MISFET of claim 2 wherein the lateral current conduction path is controlled by an applied gate source bias.

4. The LEGaN-MISFET of claim 1 wherein the MIS gate structure further comprises a trench formed through the resurf layer in contact with the body region having side walls and a bottom, and the gate dielectric material includes a passivating dielectric layer formed on the walls and bottom.

5. The LEGaN-MISFET of claim 1 further comprising a source metal contact formed on the source region extending through the source region and resurf layer in electrical contact with the body region wherein a conductive inversion channel is formed by the channel when a sufficient positive bias is applied between the gate and source terminals.

6. The LEGaN-MISFET of claim 4 wherein a distance $L_{drift}$ of a side wall of the trench from the drain region primarily determines the breakdown voltage of the device if the vertical breakdown voltage is greater than this voltage.

7. The LEGaN-MISFET of claim 1 having a blocking voltage of 300V to 5 kV.

8. The LEGaN-MISFET of claim 1 further comprising a substrate in contact with the body region wherein the substrate layer has a carrier concentration of dopant atoms of 0 cm$^{-3}$ to $1\times10^{22}$ cm$^{-3}$.

9. The LEGaN-MISFET of claim 8 wherein the substrate layer has a thickness of 100 to 500 μm.

10. The LEGaN-MISFET of claim 1 wherein the resurf layer has a carrier concentration of dopant atoms of $1\times10^{15}$ cm$^{-3}$ to $1\times10^{19}$ cm$^{-3}$.

11. The LEGaN-MISFET of claim 7 wherein the resurf layer has a thickness of 0.01 to 5 μm.

12. The LEGaN-MISFET of claim 1 wherein the body region has a carrier concentration of dopant atoms of less than $10^{17}$ cm$^{-3}$.

13. The LEGaN-MISFET of claim 1 wherein the face of the gallium nitride is one of 0001, 000-1, and 11-20.

14. The LEGaN-MISFET of claim 1 wherein having a specific on resistance of less than 300 mΩ-cm$^2$.

15. The LEGaN-MISFET of claim 1 wherein the doping $N_{resurf}$ of the resurf layer by thickness of the resurf layer is expressed as range of plus or minus 50% of:

$$\frac{1}{L_{Drift}} \int_0^{tresurf} \int_0^{L_{Drift}} N_{resurf}(x, y) \partial x \partial y + \frac{\varepsilon \times E_{cr}}{q}$$

where $E_{cr}$ is the critical breakdown electric field of the Gallium Nitride, $\in$ is the dielectric constant of Gallium Nitride, 'q' is the electronic charge, and $L_{Drift}$ is the distance between the drain region and the gate region.

16. The LEGaN-MISFET of claim 6, wherein where $L_{Drift}$ is expressed as:

$$L_{Drift} = \frac{(\text{Between 2 and 1}) \times BV_{Lat}}{E_{cr}}$$

where $BV_{lat}$ is the lateral breakdown voltage between source and drain and $E_{cr}$ is the critical electric field of the semiconductor.

17. The LEGaN-MISFET of claim 1 wherein the first conductivity type is p-type and the second conductivity type is n-type.

18. The LEGaN-MISFET of claim 1 wherein the first conductivity type is n-type and the second conductivity type is p-type.

19. The LEGaN-MISFET of claim 2 wherein the junction between the resurf layer and the body region provides a voltage blocking PN junction below the current lateral conduction path in the resurf layer and the body region a substantially continuous, linear gradation of voltage in the resurf layer between the gate structure and the drain region.

20. A Lateral Epitaxial Gallium Nitride metal insulator semiconductor field effect transistor (LEGaN-MISFET) comprising:

a body region including at least one layer formed of Gallium Nitride having a first conductivity type formed on a substrate;

a resurf layer of Gallium Nitride having a second conductivity type formed on the body region;

a source region in contact with the resurf layer;

a drain region, in contact with the resurf layer and spaced apart from the source region;

a gate metal insulator semiconductor (MIS) structure in contact with the body region, the gate MIS structure including a trench formed through the resurf layer in contact with the body region having side walls and a bottom, a passivating dielectric layer formed on the walls and bottom, and a gate contact formed on the dielectric layer; and a MIS conductive inversion channel along the surface of the body region in contact with the gate MIS structure.

\* \* \* \* \*